US007807985B2

(12) United States Patent
Itoh

(10) Patent No.: US 7,807,985 B2

(45) Date of Patent: Oct. 5, 2010

(54) ION BEAM INSPECTION APPARATUS, ION BEAM INSPECTING METHOD, SEMICONDUCTOR MANUFACTURING APPARATUS, AND ION SOURCE APPARATUS

(75) Inventor: Masaaki Itoh, Chiba (JP)

(73) Assignee: Seiko Instruments Inc. (JP)

( * ) Notice: Subject to any disclaimer, the term of this patent is extended or adjusted under 35 U.S.C. 154(b) by 74 days.

(21) Appl. No.: 12/080,999

(22) Filed: Apr. 8, 2008

(65) Prior Publication Data

US 2008/0265180 A1 Oct. 30, 2008

(30) Foreign Application Priority Data

Apr. 9, 2007 (JP) ............................ 2007-101321

(51) Int. Cl.
*G21K 5/10* (2006.01)

(52) U.S. Cl. ............................ 250/492.21; 250/492.1; 250/492.2

(58) Field of Classification Search ....................... None
See application file for complete search history.

(56) References Cited

U.S. PATENT DOCUMENTS 4,851,668 A * 7/1989 Ohno et al. ................. 250/251
5,023,462 A * 6/1991 Yamada et al. ........... 250/492.2
5,457,324 A * 10/1995 Armour et al. ......... 250/492.21
5,504,340 A * 4/1996 Mizumura et al. ..... 250/492.21
5,583,344 A * 12/1996 Mizumura et al. ..... 250/492.21
5,825,035 A * 10/1998 Mizumura et al. ...... 250/423 R
6,169,288 B1 * 1/2001 Horino et al. ............ 250/423 P
6,744,225 B2 * 6/2004 Okamura et al. ............ 315/505
6,762,422 B2 * 7/2004 Yamaguchi et al. ...... 250/491.1
6,909,102 B1 * 6/2005 Buccos .................. 250/492.21
6,943,351 B2 * 9/2005 Parker et al. ................... 850/6
7,138,629 B2 * 11/2006 Noji et al. ................... 250/311
7,307,262 B2 * 12/2007 Van Dijsseldonk et al. ....... 250/492.1
7,365,324 B2 * 4/2008 Noji et al. ................... 250/310
2006/0113493 A1 * 6/2006 Kabasawa et al. ...... 250/492.21
2007/0194225 A1 * 8/2007 Zorn .......................... 250/306

FOREIGN PATENT DOCUMENTS

JP 11111185 A * 4/1999

OTHER PUBLICATIONS

Patent Abstracts of Japan, publication No. 64-014855, publication date Jan. 19, 1989.

* cited by examiner

*Primary Examiner*—Bernard E Souw
*Assistant Examiner*—Andrew Smyth
(74) *Attorney, Agent, or Firm*—Adams & Wilks

(57) ABSTRACT

The central axis of a source head and an extraction electrode is aligned on a line, and confirmed by a laser beam whether the line is coaxial with the ion beam axis. Thus, a light emitting unit that emits the laser beam on the ion beam axis is fitted to a housing instead of the source head, and a reflector that reflects the laser beam is fitted to the extraction electrode. A light emitting apparatus also has a function of detecting the laser beam to detect the laser beam that is reflected by the reflector, and sends the intensity of the detected laser beam to a control unit. The extraction electrode is positionally adjusted so that the intensity of the laser beam becomes maximum, whereby the ion beam axis can coincide with the central axes of the ion source and the extraction electrode.

19 Claims, 8 Drawing Sheets

ION BEAM INSPECTION APPARATUS, ION BEAM INSPECTING METHOD, SEMICONDUCTOR MANUFACTURING APPARATUS, AND ION SOURCE APPARATUS

BACKGROUND OF THE INVENTION

1. Field of the Invention

The present invention relates to an ion beam inspection apparatus, an ion beam inspecting method, a semiconductor manufacturing apparatus and an ion source apparatus, and relates to, for example, a technique for supporting the position adjustment of an extraction electrode that extracts ions implanted into a semiconductor from an ion source.

2. Description of the Related Art

A semiconductor integrated circuit is manufactured in such a manner that ions are implanted into a semiconductor wafer to form p-type regions or n-type regions.

In the implantation of ions, there has been employed a semiconductor manufacturing apparatus that conducts a series of process steps such as generation of ions by heating a gas to a high temperature, extraction of generated ions by the extraction electrode, sorting of extracted ions by a mass analyzer, focusing of sorted ions, and irradiation of the wafer with the focused ions.

In order to operate the semiconductor manufacturing apparatus, it is necessary to conduct many kinds of adjustments, one of which is to adjust the position of the extraction electrode.

FIG. 8A is a conceptual diagram showing the outline of an ion source apparatus.

An ion source apparatus 1 has an ion source 6 and an extraction electrode 3 that extracts ions from the ion source 6 in the interior of a cylindrical housing 5.

The ion source 6 includes a disc-shaped fitting flange 4, a cylindrical member 7 that is disposed on the central axis of the fitting flange 4, and a source head 2 that is disposed on a leading end of the cylindrical member 7.

The ion source 6 is fitted to the housing 5 in such a manner that the source head 2 is inserted into the housing 5 and the fitting flange 4 is fixed on one end surface of the housing 5.

An O-ring (not shown) is equipped between the fitting flange 4 and the end surface of the housing 5 so as to keep the airtightness in the interior of the housing 5.

A gas intake not shown is defined in an end surface of the fitting flange 4. The gas that has been taken in from the gas intake is heated to a high temperature by means of a filament within the source head 2 to generate ions.

The extraction electrode 3 is disposed at a certain distance from the end surface of the source head 2, and applied with a high voltage. The extraction electrode 3 is set to a negative potential when the ions that are generated in the source head 2 are positive ions. On the other hand, the extraction electrode 3 is set to a positive potential when the negative ions are generated, so as to extract ions from the source head 2 and accelerate the ions to form an ion beam as indicated by an arrow.

The extraction electrode 3 is formed with an opening 16 called aperture having a substantially rectangular cross section, and an ion beam 15 is formed according to the shape of the opening, and introduced to the interior of the semiconductor manufacturing apparatus.

An arm 18 is fitted to a lateral side of the extraction electrode 3 in a direction perpendicular to the paper surface. The arm 18 is rotated around the central axis of the arm 18 or traveled horizontally in a central axial direction of the arm 18, thereby making it possible to adjust the position of the extraction electrode 3.

In the ion source apparatus 1, in order to enhance the generation efficiency of the ion beam 15, it is important to conduct the centering adjustment that matches the central axis of the ion source 6 with the central axis of the opening 16.

For example, as shown in FIG. 8B, when the extraction electrode 3 is inclined with respect to the central axis of the ion source 6, the ion beam 15 is slanted and nonuniformily hits the opening 16, causing waste of the ions, wear-out of the opening 16, and increase of deposit that adheres to the extraction electrode 3.

The centering adjustment is required every time the maintenance work such as cleaning of the ion source apparatus 1, exchange of a filament of the source head 2, or exchange of the extraction electrode 3 is conducted. Up to now, the centering adjustment has been conducted as follows.

The semiconductor manufacturing apparatus is completely stopped, the ion source apparatus 1 is removed, and parts such as the filament are exchanged. Then, after the position of the extraction electrode 3 is measured by the aid of mechanical tool such as a slide gauge or a scale, and coarsely adjusted, the ion source apparatus 1 is fitted to the semiconductor manufacturing apparatus.

Subsequently, after a high vacuum is created in the entire semiconductor manufacturing apparatus in several hours, the semiconductor manufacturing apparatus is actually irradiated with the ion beam 15 from the ion source apparatus 1. Then, the position of the extraction electrode 3 is finely adjusted so that a value of current that arises in the extraction electrode 3 (suppression current) becomes minimum.

When the ion beam 15 hits the extraction electrode 3, current flows into the extraction electrode 3 from the source head 2. Accordingly, the size of the current value corresponds to the quantity of the ions that hit the extraction electrode 3.

In the above method, a high vacuum must be created in the semiconductor manufacturing apparatus, and the ion beam 15 must be actually irradiated in the semiconductor manufacturing apparatus. For that reason, a centering adjustment using a laser beam as disclosed in JP 64-14855 A has been proposed.

In the above technique, a light source is arranged on the end surface of the source head 2, and a slit through which a light from the light source is transmitted is arranged in the extraction electrode. Also, a detector for the transmitted light is arranged on a side of the slit opposite to the extraction electrode.

The position of the extraction electrode is adjusted so that the intensity of the transmitted light becomes the largest, to thereby conduct the centering adjustment.

However, because the temperature of the source head 2 and the extraction electrode 3 becomes high, which exceeds 1,000 [° C.] during the operation, it is extremely difficult to locate the light source and the detector in the ion source apparatus 1. For that reason, the possibility of actual use seems quite low.

Incidentally, the inventor of the present invention has found out that the inclination of the central axis of the ion source 6 with respect to the central axis of the extraction electrode 3 due to the uneven fitting of the fitting flange 4 as shown in FIG. 8C also causes deterioration in the generation efficiency of the ion beam 15.

SUMMARY OF THE INVENTION

Under the above circumstances, an object of the present invention is to conduct the centering adjustment of the ion source apparatus with ease and high efficiency.

In order to achieve the object of the present invention, according to a first aspect of the present invention, there is provided an ion beam inspection apparatus that is used when adjusting a position of an extraction electrode that extracts an ion beam from an ion source in a semiconductor manufacturing apparatus where ions are implanted into a semiconductor, the ion beam inspection apparatus including: laser beam irradiating means for irradiating a laser beam on an ion beam axis toward the extraction electrode from an ion source side; and pass position detecting means for detecting a pass position at which the irradiated laser beam passes through the extraction electrode.

According to a second aspect of the present invention, there is provided the ion beam inspection apparatus according to the first aspect of the present invention, in which the pass position detecting means includes: a reflecting mirror that is disposed on a location of the extraction electrode where the ion beam is to be positioned; and measuring means for measuring intensity of the laser beam that is reflected by the reflecting mirror, and in which the pass position of the irradiated laser beam is detected by the measured intensity of the laser beam.

According to a third aspect of the present invention, there is provided the ion beam inspection apparatus according to the first aspect of the present invention, in which the pass position detecting means includes: light receiving means that is disposed on a location of the extraction electrode where the ion beam is to be positioned; and measuring means for measuring intensity of the laser beam that is received by the light receiving means, and in which the pass position of the irradiated laser beam is detected by the measured intensity of the laser beam.

According to a fourth aspect of the present invention, there is provided the ion beam inspection apparatus according to the second aspect or the third aspect of the present invention, further including position adjusting means for adjusting the position of the extraction electrode so that the measured intensity of the laser beam becomes maximum.

According to a fifth aspect of the present invention, there is provided an ion beam inspecting method that is conducted when adjusting a position of an extraction electrode that extracts an ion beam from an ion source in a semiconductor manufacturing apparatus where ions are implanted into a semiconductor, the ion beam inspecting method including: irradiating a laser beam on an ion beam axis toward the extraction electrode from an ion source side by laser beam irradiating means; and detecting a pass position at which the irradiated laser beam passes through the extraction electrode by pass position detecting means.

According to a sixth aspect of the present invention, there is provided a semiconductor manufacturing apparatus having an ion source and an extraction electrode that extracts an ion beam from the ion source, which irradiates the extracted ion beam to a semiconductor to implant ions into the semiconductor, the semiconductor manufacturing apparatus including: laser beam irradiating means for irradiating a laser bean on an ion beam axis toward the extraction electrode from an ion source side; pass position detecting means for detecting a pass position at which the irradiated laser beam passes through the extraction electrode; and adjusting means for adjusting a position of the extraction electrode so that the detected pass position becomes the pass position of the ion beam.

According to a seventh aspect of the present invention, there is provided an ion source apparatus including: a case; an ion source that is fixed to one end surface of the case and inserted into an interior of the case; and an extraction electrode that is disposed in the interior of the case and extracts an ion beam from the ion source toward another end surface side of the case, in which the ion source is fixed at least three points that are not aligned in a line on the one end surface of the case.

According to the present invention, the centering adjustment of the ion source apparatus can be conducted with ease and high efficiency by the aid of a jig that irradiates a laser beam on the axis of the ion beam.

DETAILED DESCRIPTION OF THE PREFERRED EMBODIMENT

(1) Outline of Embodiment

In this embodiment, it is confirmed by a laser beam whether the central axes of a source head and an extraction electrode are collinear, and coaxial with an ion beam axis, or not.

Figure 2A:
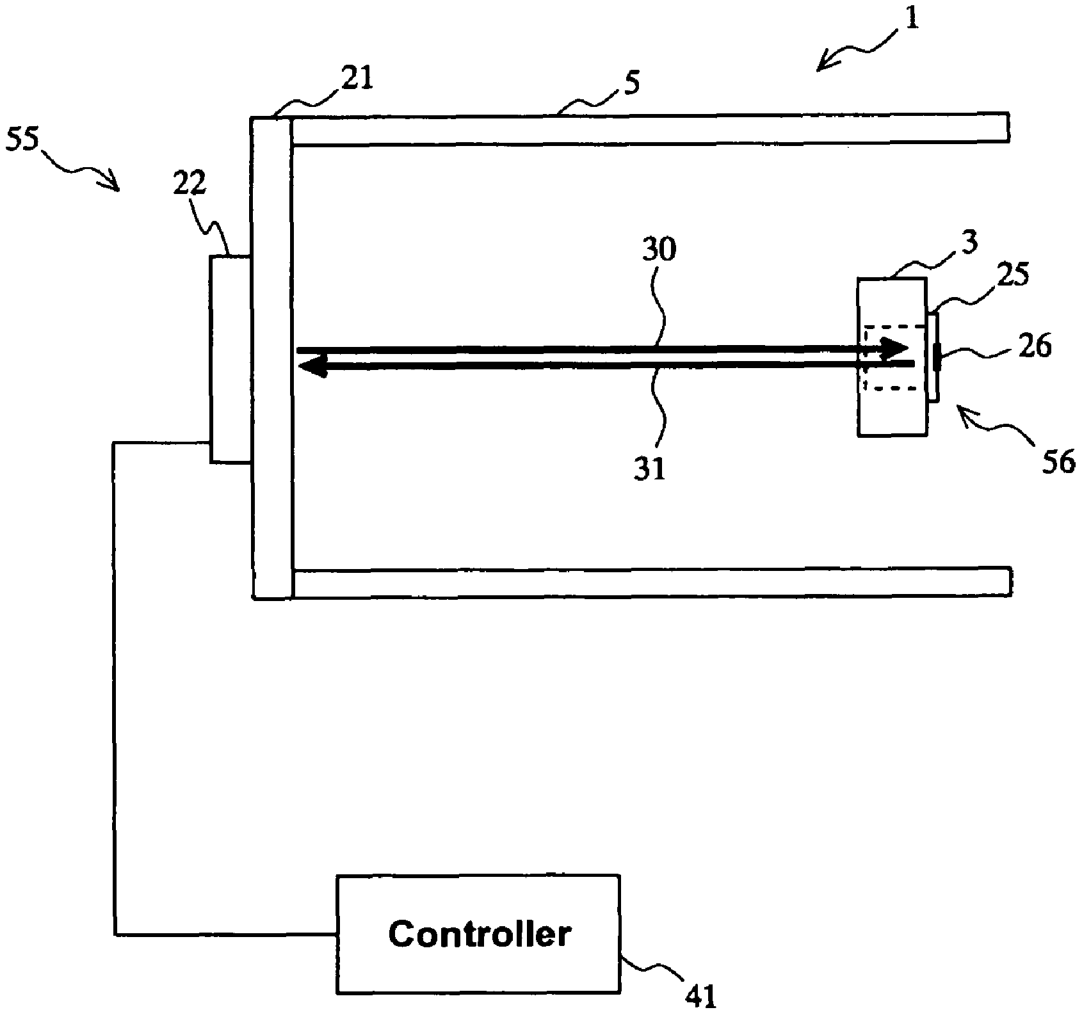
FIGS. 2A and 2B are diagrams for explaining an inspection apparatus according to the embodiment.

For that reason, as shown in FIG. 2A, a light emitting unit 55 that irradiates a laser beam on the ion beam axis is fitted to a housing 5 instead of a source head. On the other hand, a reflector 56 that reflects the laser beam is fitted to an extraction electrode 3.

A light emitting apparatus 22 has a function of emitting a laser beam as well as a function of detecting the laser beam. The light emitting apparatus 22 detects the laser beam that has been reflected by the reflector 56, and outputs the detected intensity to a control unit 41.

The ion source is positioned by an end surface of the housing 5 as in the case of the light emitting unit 55. Therefore, the extraction electrode 3 is positionally adjusted so that the intensity of the laser beam becomes maximum, thereby making it possible to match the ion beam axis with the central axes of the ion source and the extraction electrode 3.

(2) Details of Embodiment

Figure 1:
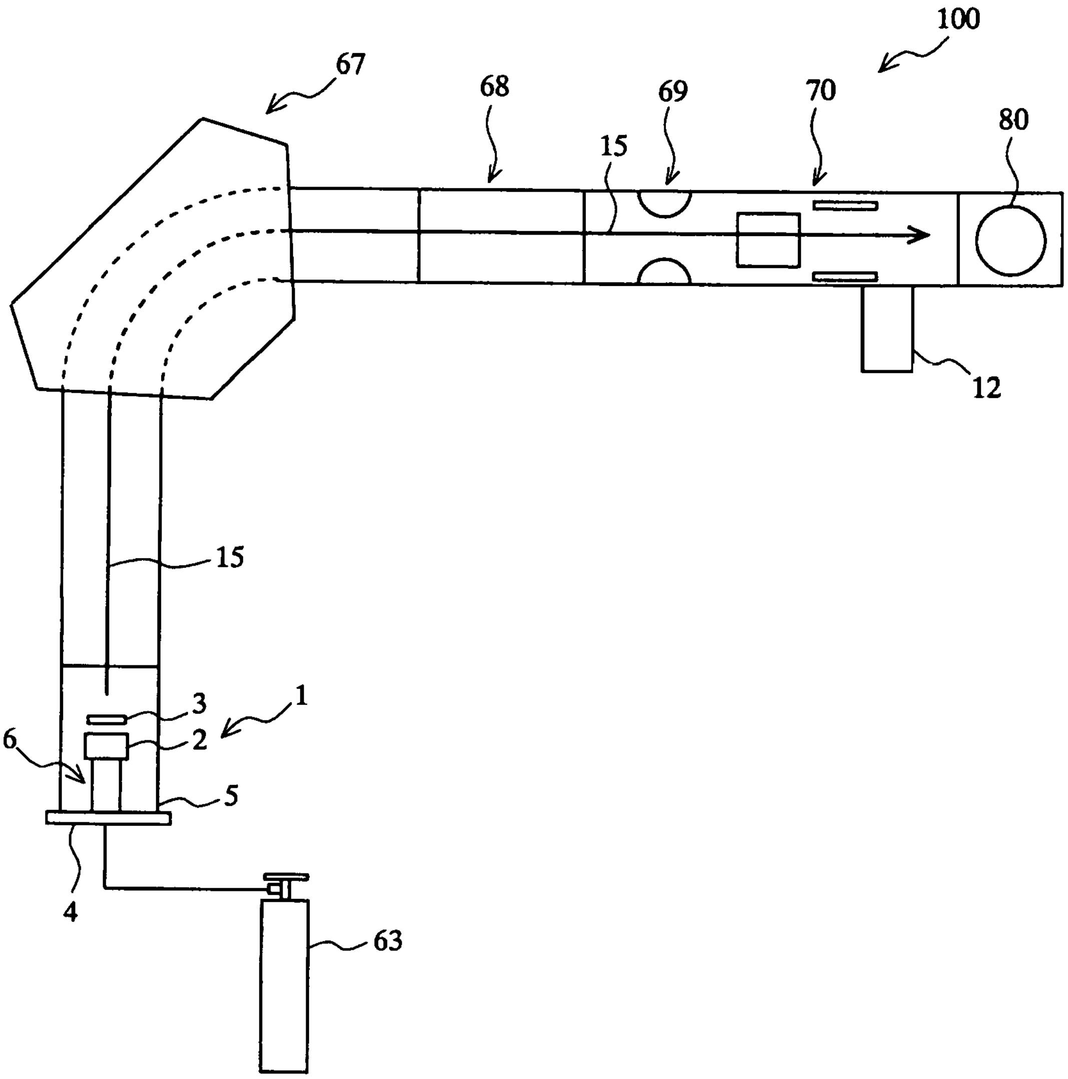
FIG. 1 is a diagram schematically showing an entire semiconductor manufacturing apparatus according to an embodiment.

FIG. 1 is a diagram schematically showing an entire semiconductor manufacturing apparatus according to this embodiment.

A semiconductor manufacturing apparatus 100 is an ion implanting apparatus that implants ions into a wafer 80 of a semiconductor.

The semiconductor manufacturing apparatus 100 includes an ion source apparatus 1, a mass analysis unit 67, an acceleration unit 68, a Q lens (quadrupole lens) 69, a scanner 70, and a vacuum pump 12.

The ion source apparatus 1 receives a gas that is a raw material of ion generation from a gas cylinder 63, and ionizes the supplied gas by the aid of a source head 2. The ion source apparatus 1 then extracts ions by the aid of the extraction electrode 3, forms an ion beam 15, and irradiates the interior of the semiconductor manufacturing apparatus 100 with the ion beam 15.

Although not shown, magnets are located in front and at the back of the source head 2 in the exterior of the source head 2, and have a function of focusing the ion beam 15.

The mass analysis unit 67 is used to sort a desired kind of ions (for example, phosphorus, boron, etc.) from plural kinds of ions that are contained in the ion beam 15.

The mass analysis unit 67 bends an orbit of the ion beam 15 by means of a magnetic field. Because the radius of curvature is different according to the mass of ions, the magnetic field is applied to the ion beam 15 so that the desired ions are advanced along a beam line where the acceleration unit 68 is located.

The acceleration unit 68 is an acceleration tube that accelerates the ions by means of, for example, a high frequency electric field.

The Q lens 69 is a lens that focuses the ion beam 15 by the aid of the electric field.

The scanner 70 is constituted by, for example, two pairs of electrodes that are located in a horizontal direction and a vertical direction. The scanner 70 shapes the orbit of the ion beam 15 by the aid of the electric field, and scans the surface of the wafer 80 with the ion beam 15.

The vacuum pump 12 is a pump such as a cryopump which is capable of creating a high vacuum. The vacuum pump 12 exhausts a gas from the interior of the semiconductor manufacturing apparatus 100 to keep the high vacuum.

Subsequently, a description will be given of a fundamental concept of a method of conducting the centering adjustment (alignment) of the extraction electrode by the aid of the inspection apparatus according to this embodiment with reference to FIGS. 2A and 2B.

As shown in FIG. 2A, the inspection apparatus (ion beam inspection apparatus) according to this embodiment includes the light emitting unit 55, the reflector 56, and the control unit 41.

The light emitting unit 55 includes the light emitting apparatus 22 that emits the laser beam, and a plate 21 that holds the light emitting apparatus 22 with respect to the housing 5. The reflector 56 includes a mirror 26 (reflecting mirror) that reflects the laser beam, and a columnar member 25 that holds the mirror 26. The mirror 26 can be formed of, for example, a reflection seal.

The centering adjustment of the extraction electrode 3 according to this inspection apparatus is conducted in the atmosphere after the ion source apparatus 1 is removed from the semiconductor manufacturing apparatus 100 (FIG. 1).

With the above configuration, when a spare ion source apparatus 1 is prepared, the operation of the semiconductor manufacturing apparatus 100 can be maintained with the use of the spare ion source apparatus 1 even during the work such as cleaning of the ion source apparatus 1, the maintenance work, or the centering adjustment.

The plate 21 is a disc member made of metal or resin, and has the same reference hole or fitting hole as that of the fitting flange 4 of the ion source 6.

The plate 21 is fitted to the ion source 6 fitting surface of the housing 5 after the ion source 6 (FIG. 1) is removed from the housing 5.

The light emitting apparatus 22 is fixed on the plate 21 so that the optical axis of the laser beam coincides with the axis of the ion beam.

The light emitting apparatus 22 has a function of irradiating the laser beam having a given beam diameter, and a function of receiving the laser beam that has been reflected by the mirror 26 to detect the intensity of the received beam.

As described above, the light emitting unit 55 is capable of irradiating the laser beam on the ion beam axis from the light emitting apparatus 22, and functions as a laser beam irradiating part for irradiating the laser beam on the ion beam axis toward the extraction electrode from the ion source side.

Also, the light emitting apparatus 22 functions as a measuring part for measuring the intensity of the laser beam that has been reflected by the mirror 26 which is a reflecting mirror disposed on a portion where the ion beam should be positioned in the extraction electrode 3.

As described above, the light emitting unit 55 includes a passing position detecting part for detecting a passing position at which the irradiated laser beam passes through the extraction electrode, and detects the passing position of the irradiated laser beam according to the intensity of the laser beam.

The control unit 41 supplies an electric power for emitting the laser beam to the light emitting apparatus 22, receives the intensity of the reflected light which has been output by the light emitting apparatus 22 from the light emitting apparatus 22, and outputs the intensity to a given output destination apparatus by a voltage value (return voltage).

For example, the output destination apparatus is a display apparatus that displays the intensity of the reflected light, and an operator can confirm how much reflected light is received by the light emitting apparatus 22 according to the display.

Also, when a mechanism for automatically correcting the position of the extraction electrode 3 is provided, a control unit for the mechanism can be assigned as an output destination apparatus.

Incidentally, in the extraction electrode 3, a recess having a columnar surface centered on the ion beam axis is formed behind the aperture through which the ion beam passes (at the outlet side of the ion beam).

The aperture is formed by inserting a columnar aperture member having the aperture formed therein into the recess. Because the aperture member is a wear product, the aperture member is detachably attached to the extraction electrode 3. That is, the recess is a fitting hole for fitting the aperture member to the extraction electrode 3.

On the other hand, the columnar member 25 of the reflector 56 is constituted by a columnar member having the same outer diameter as that of the aperture member, and can be attached behind the aperture member in the recess.

Figure 2B:
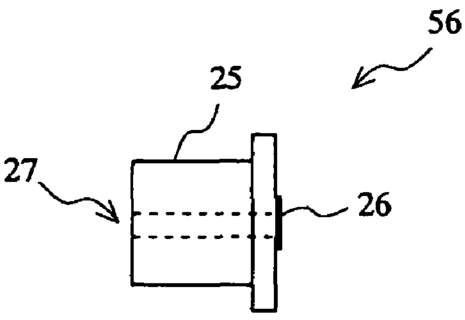

As shown in FIG. 2B, a through-hole 27 having the same diameter or substantially the same diameter as the laser beam diameter is formed on the central axis of the columnar member 25. The central axis of the through-hole 27 coincides with the ion beam axis in a state where the columnar member 25 is attached in the extraction electrode 3.

The mirror 26 having a planar mirror surface is fixed to an end surface of the columnar member 25 at the ion beam traveling side through the through-hole 27 so that the mirror surface is directed toward the light emitting apparatus 22 so as to be perpendicular to the central axis of the columnar member 25.

In the inspection apparatus configured as described above, in the case where the extraction electrode 3 is positioned so that the central axis of the aperture of the extraction electrode 3 coincides with the ion beam axis, when the laser beam is emitted from the light emitting apparatus 22, an irradiated beam 30 is reflected by the mirror 26, and a reflected beam 31 reaches the light emitting apparatus 22 through the same optical path as that of the irradiated beam 30 as shown in FIG. 2A.

In this embodiment, the "position" means a three-dimensional posture, and conceptually includes not only the positions in the horizontal direction and the vertical direction, but also a layout angle.

Further details will be described below. When the extraction electrode 3 is inclined, because the through-hole 27 and the beam diameter of the irradiated beam 30 are substantially equal to each other, the irradiated beam 30 that has been input to the through-hole 27 is shut out by the inner wall of the through-hole 27. As a result, the light amount of irradiated beam 30 that reaches the mirror 26 is reduced. For that reason, when the inner wall of the through-hole 27 is colored by a color such as black which makes it difficult to reflect the laser beam therefrom in advance, it is estimated to further enhance the effect of reducing the light amount of the irradiated beam 30.

Also, because the optical path of the reflected beam 31 that has been reflected by the mirror 26 is inclined with respect to the optical path of the irradiated beam 30, the intensity of the reflected beam 31 that reaches the light receiving unit of the light emitting apparatus 22 is remarkably deteriorated.

Also, when the position of the aperture of the extraction electrode 3 is not on the ion beam axis even if the extraction electrode 3 is not inclined, the intensity of the reflected beam 31 that is received by the light emitting apparatus 22 is remarkably deteriorated.

For that reason, when the central axis of the irradiated beam 30 coincides with the central axis of the columnar member 25, that is, when the extraction electrode 3 is situated at a position where the ion beam axis coincides with the central axis of the aperture, the intensity of the reflected beam 31 which is detected by the light emitting apparatus 22 becomes maximum.

The operator adjusts the position of the extraction electrode 3 so that the intensity of the reflected beam 31 becomes maximum, thereby making it possible to conduct the centering adjustment of the extraction electrode 3 with ease and precision.

Figure 3A:
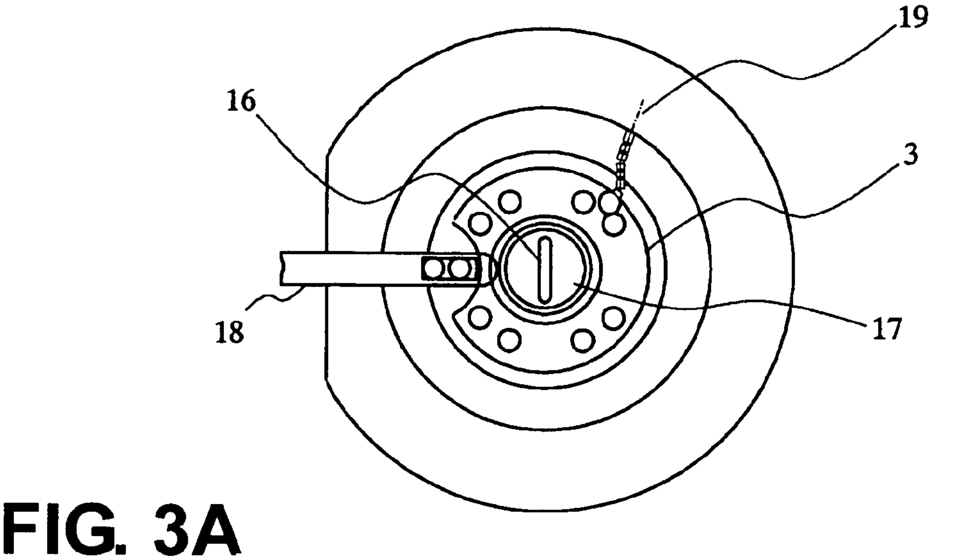
FIGS. 3A to 3C are front and side views showing an extraction electrode, respectively.

FIG. 3A is a front view showing the extraction electrode 3 viewed from the outlet side of the ion beam.

As shown in the figure, the cylindrical recess is formed in the center of the extraction electrode 3, and an aperture member 17 is attached in the cylindrical recess. An opening 16 that is a substantially rectangular through-hole whose both ends are rounded is defined in the center of the aperture member 17 so that the central axis of the opening 16 coincides with the central axis of the extraction electrode 3.

An arm 18 is fitted to a lateral surface of the extraction electrode 3, and can rotate around the axial line or travel in the horizontal direction by means of a drive mechanism not shown.

Further, a power cable 19 is fitted to the extraction electrode 3 so as to apply a potential to the extraction electrode 3 or the aperture member 17.

Figure 3B:
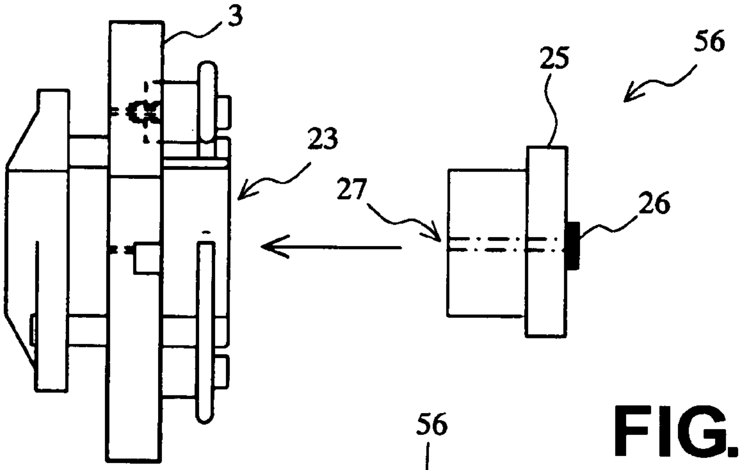

FIG. 3B is a side view showing a state in which the reflector 56 is being fitted to the extraction electrode 3.

As indicated by an arrow, the reflector 56 is attached behind the aperture member 17 not shown (outlet side of the ion beam) from a recess 23 of the extraction electrode 3 to attach the reflector 56 to the extraction electrode 3.

Figure 3C:
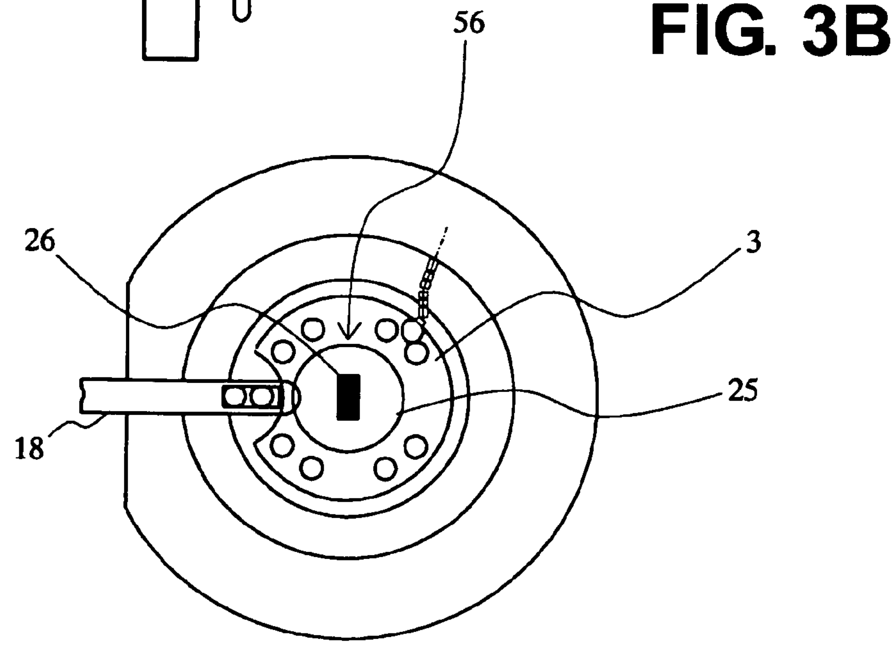

FIG. 3C is a front view showing a state in which the reflector 56 is attached to the extraction electrode 3 viewed from the outlet side of the ion bean.

As shown in the figure, in the recess 23 of the extraction electrode 3, the columnar member 25 is attached behind the aperture member 17, and the mirror 26 is arranged at a location where the opening 16 is positioned.

Figure 4:
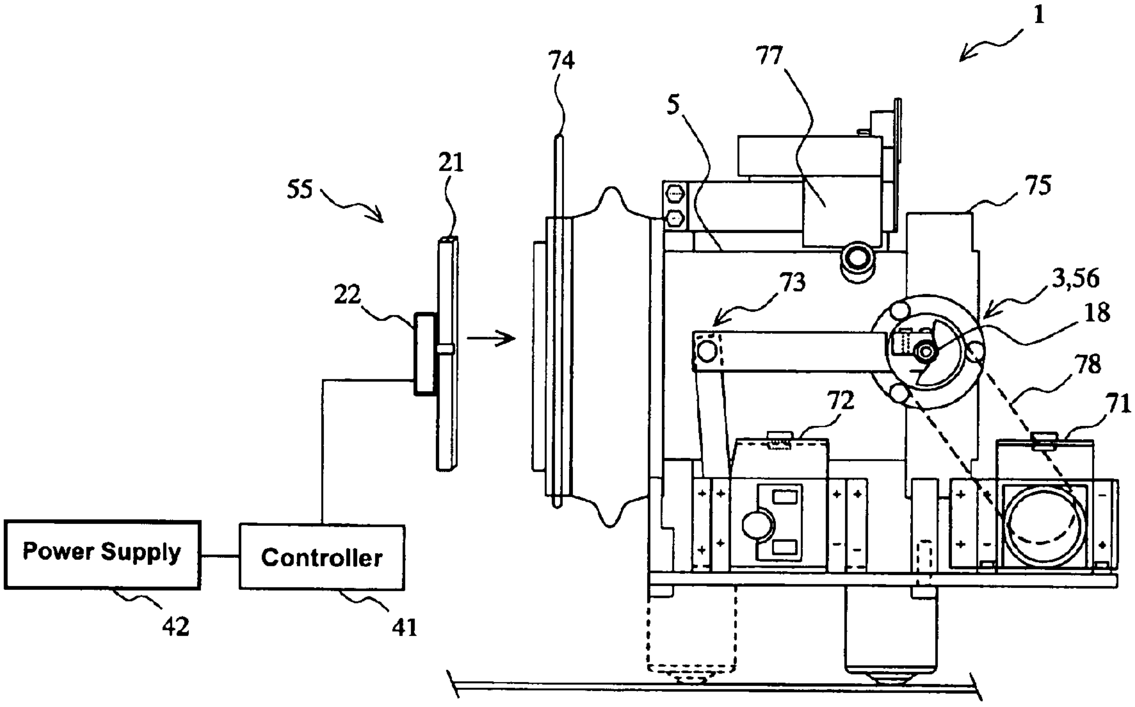
FIG. 4 is a side view showing an ion source apparatus.

FIG. 4 is a side view showing a state in which the light emitting unit 55 is attached to the ion source apparatus 1.

FIG. 4 shows a state in which the ion source apparatus 1 (FIG. 1) is removed from the semiconductor manufacturing apparatus 100, and a magnet 77 for converging the ion beam is attached to the upper portion of the housing 5. The magnet 77 is removable, and can be removed from the housing 5.

An ion source fitting flange 74 is formed on the aperture end of the housing 5, and a reference hole (guide hole) for fitting the fitting flange 4 (FIG. 1) of the ion source 6 and a fitting screw hole which are not shown are defined in the end surface of the ion source fitting flange 74.

In the case of fitting the light emitting unit 55, the ion source 6 is removed from the ion source fitting flange 74, and the light emitting unit 55 is fitted to the ion source fitting flange 74.

A reference hole and a screw hole which are compatible with the fitting flange 4 of the ion source 6 are formed in the plate 21, and the plate 21 is fitted to the ion source fitting flange 74.

Then, the control unit 41 is driven by an electric power of the power supply 42, and the light emitting apparatus 22 irradiates the laser beam on the ion beam axis under the control of the control unit 41, and detects the reflected beam from the reflector 56 not shown.

On the other hand, a flange 75 that connects the housing 5 to the main body of the semiconductor manufacturing apparatus 100 is formed on an end of the housing 5 at the ion beam outlet side.

The arm 18 is inserted into the lateral surface of the flange 75 while keeping airtightness, and rotatably supported by the lateral surface thereof.

The extraction electrode 3 not shown is held on the leading end of the arm 18 at the inner side of the flange 75. The reflector 56 is fitted to the extraction electrode 3.

Also, a horizontal adjustment motor 71 and an angle adjustment motor 72 are fitted on the outer portion of the housing 5.

The horizontal adjustment motor 71 is so designed as to transmit a rotational force to the horizontal travel mechanism of the arm 18 by a drive force transmission member 78 such as a belt or a chain.

The horizontal travel mechanism is formed with a screw, and upon rotating by the drive force transmission member 78, the horizontal travel mechanism travels the arm 18 in a horizontal direction that is perpendicular to the ion beam (a direction perpendicular to the paper plane). As a result, the extraction electrode 3 travels in the horizontal direction.

On the other hand, the angle adjustment motor 72 is connected to the arm 18 by the aid of a link mechanism 73, and the link mechanism 73 is driven to rotate the arm 18 around the rotating axis. With the above configuration, the extraction electrode 3 rotates around an axis that is in a horizontal direction perpendicular to the ion beam axis (a direction perpendicular to the paper plane).

As described above, the ion source apparatus 1 is designed so that the extraction electrode 3 can be traveled in the horizontal direction by the aid of the horizontal adjustment motor

71, and the extraction electrode 3 can rotate around the axis perpendicular to the ion beam by the aid of the angle adjustment motor 72.

The horizontal adjustment motor 71 and the angle adjustment motor 72 are constituted by, for example, a stepping motor, and can rotate a rotor by a given angle by the aid of a motor control unit not shown.

The operator drives the horizontal adjustment motor 71 and the angle adjustment motor 72 to adjust the position (including the angle) of the extraction electrode 3 so that the intensity of the reflected light of the laser beam which is displayed on the control unit 41 becomes maximum.

As described above, in this embodiment, the operator manually operates the horizontal adjustment motor 71 and the angle adjustment motor 72. Alternatively, the operation can be automatically conducted.

In this case, the motor control unit and the control unit 41 are connected to each other so that the intensity of the reflected light is input to the motor control unit from the control unit 41. The motor control unit controls the horizontal adjustment motor 71 and the angle adjustment motor 72 so that the intensity of the reflected light becomes the maximum.

In this case, the motor control unit functions as a position adjusting part for adjusting the position of the extraction electrode 3 so that the measured intensity of the laser beam becomes the maximum.

Also, the semiconductor manufacturing apparatus 100 having the above ion source apparatus 1 installed therein includes a laser beam irradiating part for irradiating the laser beam on the ion beam axis toward the extraction electrode from the ion source side, a pass position detecting part for detecting a pass position at which the laser beam passes through the extraction electrode, and an adjusting part for adjusting the position of the extraction electrode so that the detected pass position becomes the pass position of the ion beam.

Also, in this embodiment, the extraction electrode 3 is traveled in the horizontal direction that is perpendicular to the ion beam axis, and rotated around the horizontal axis that is perpendicular to the ion beam axis. Alternatively, the position control having more freedom degree can be conducted on the extraction electrode 3.

For example, the position of the extraction electrode 3 can be freely set with the provision of a mechanism that travels the arm 18 in the ion beam axial direction, and a mechanism that rotates the extraction electrode 3 around the vertical axis.

Figure 5:
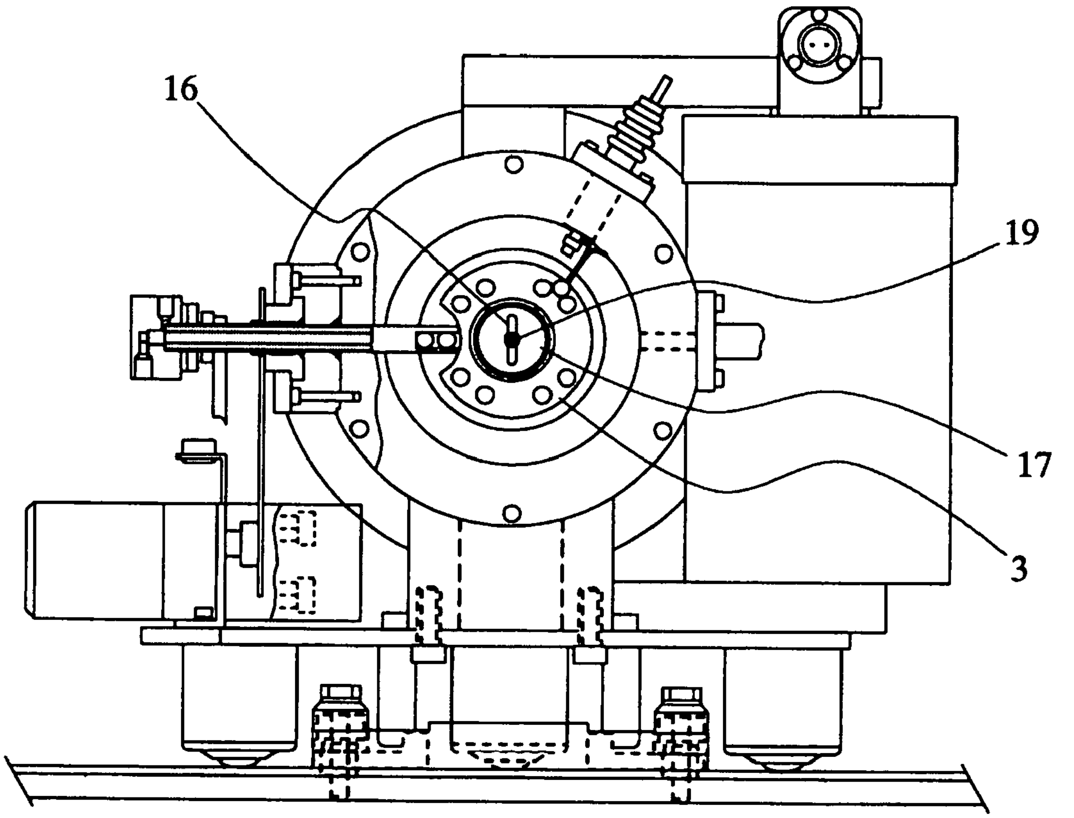
FIG. 5 is a diagram showing the extraction electrode after a centering adjustment has been completed.

FIG. 5 is a front view showing the extraction electrode 3 and the aperture member 17 after the centering adjustment of the extraction electrode 3 has been conducted.

As shown in the figure, the ion beam axis 19 is positioned around the opening 16. For that reason, ions that have been generated by the source head 2 become the most efficient ion beam.

Figure 6:
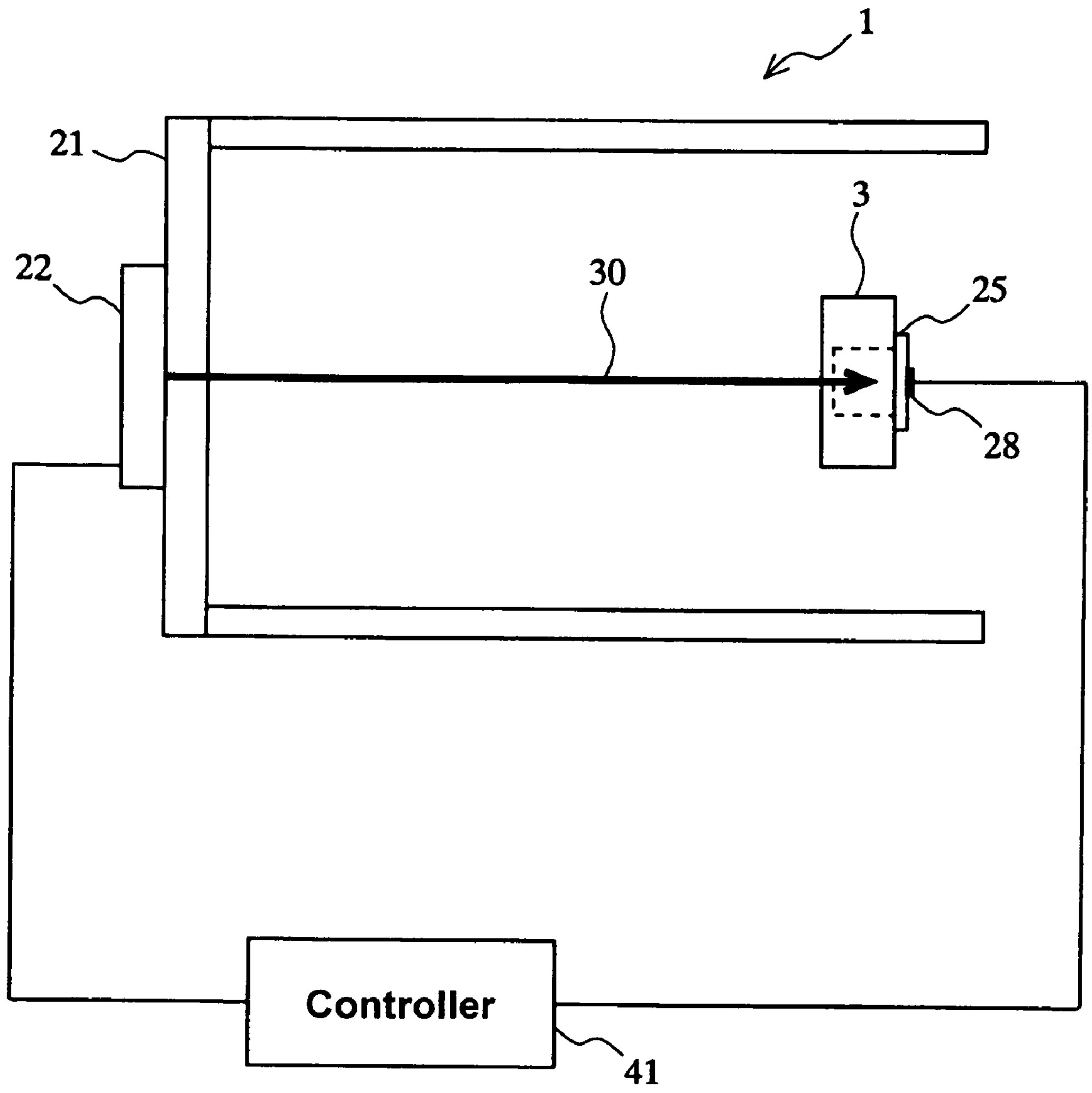
FIG. 6 is a diagram for explaining a modified example.

FIG. 6 is a diagram for explaining a modified example of this embodiment.

In this example, a light receiving unit 28 of the laser beam is located instead of the mirror 26 of the columnar member 25, and the irradiated beam 30 that has been emitted by the light emitting apparatus 22 is detected by the light receiving unit 28.

The intensity of the laser beam that has been received by the light receiving unit 28 is transmitted to the control unit 41.

Similarly, in this method, the position of the extraction electrode 3 can be subjected to centering adjustment.

As described above, in this modified example, the light receiving unit 28 functions as a light receiving part that is disposed at a location where the ion beam should be positioned in the extraction electrode 3, and the control unit 41 functions as a measuring part for measuring the intensity of the laser beam that has been received by the light receiving unit 28. The inspection apparatus detects the pass position of the irradiated laser beam according to the intensity.

Subsequently, the position adjustment of the ion source 6 will be described below.

Figure 7A:
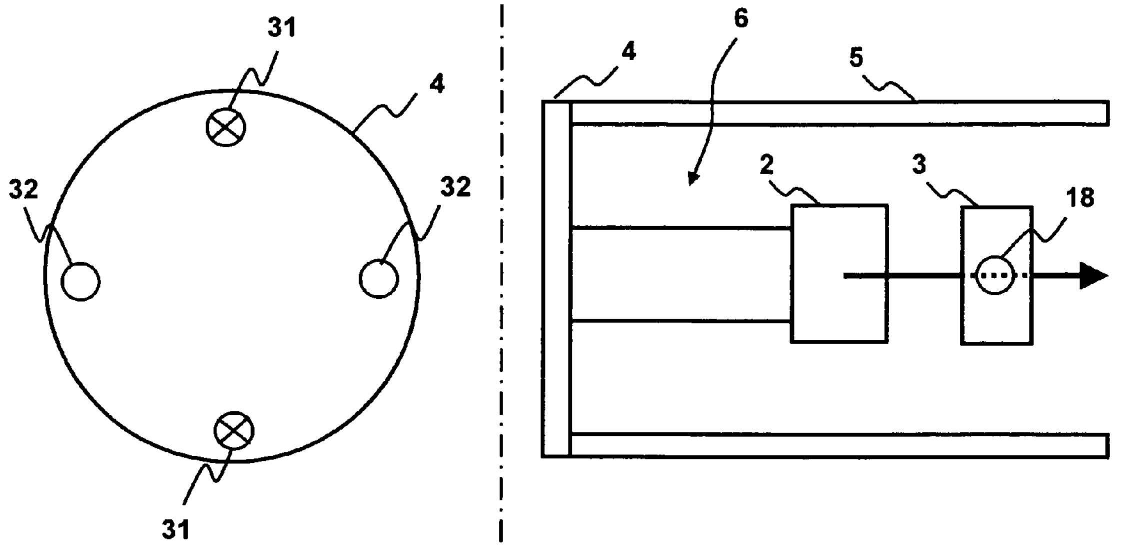
FIGS. 7A and 7B are diagrams for explaining a positional adjustment of an ion source.

FIG. 7A is a diagram showing a conventional method of fitting the ion source 6.

The housing 5 is formed with two reference holes in the horizontal direction and two screw holes in the vertical direction in order to fit the fitting flange 4 of the ion source 6. The fitting flange 4 is positioned by two reference pins 32, and the fitting flange 4 is fitted by two screws 31.

Because vacuum is created in the interior of the housing 5, the fitting flange 4 is pushed against the housing 5 by the atmospheric pressure, and an O-ring for sealing a space between the fitting flange 4 and the housing 5 is uniformly deformed to provide the position precision of the ion source 6.

In the above method, it appears that the deformation of the O-ring at the two reference pins 32 is not uniform, and the ion source 6 is slightly inclined with respect to a line that connects the two screws 31 as the center line.

This has been estimated from the fact that one side of the opening 16 (FIG. 3A) is remarkably larger in abrasion than another side thereof.

Figure 7B:
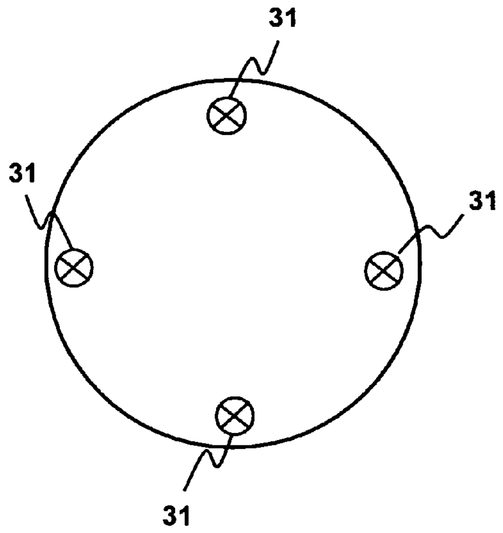
Figure 8A:
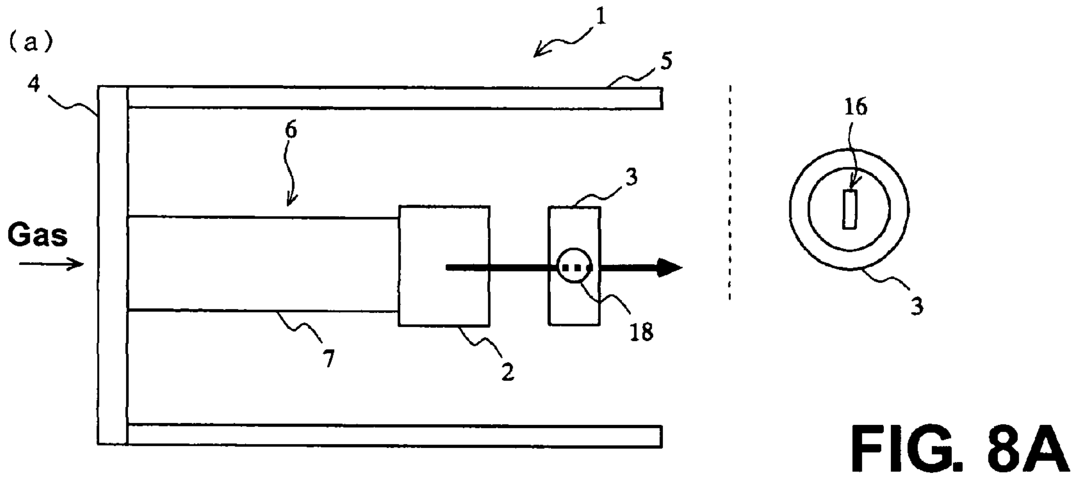
FIGS. 8A to 8C are diagrams for explaining the conventional example.
Figure 8B:
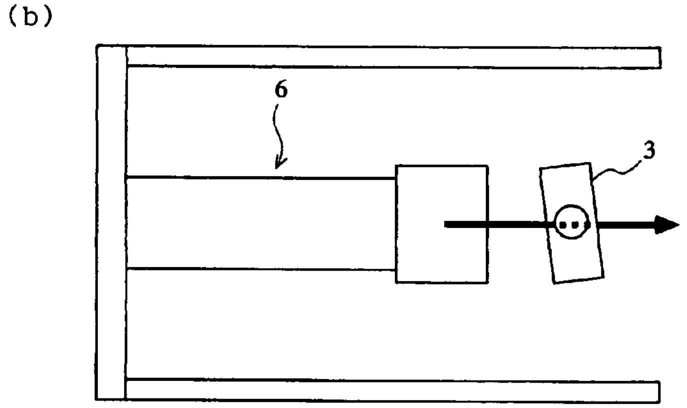
Figure 8C:
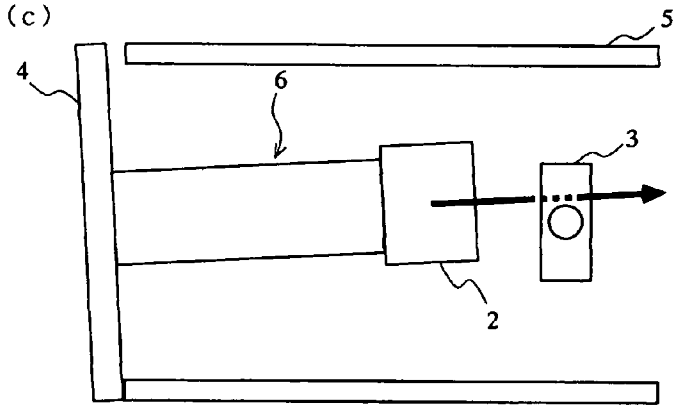

Under the above circumstances, in this embodiment, the reference pins 32 are also screwed, and four points are secured by screws 31 at circumferentially spaced-apart locations as shown in FIG. 7B.

Accordingly, the amount of abrasion on both sides of the opening 16 is uniform, and the amount of abrasion is also reduced. Consequently, the ions that have been generated at the source head 2 can be efficiently made into the ion beam.

According to this system, the fitting flange 4 must be secured by screws at least at three points which are not collinear. The ion source apparatus 1 includes a case (housing 5), an ion source (source head 2) that is fixed to one end surface of the case and inserted into the interior of the case, and an extraction electrode that is disposed in the interior of the case and extracts the ion beam from the ion source toward another end surface side of the case. The ion source is fixed at least at three points that are not collinear on one end surface of the case.

As described above, as a result of conducting the centering adjustment of the extraction electrode 3 and the ion source 6 with high precision, the following performances are specifically improved.

Up to now, a current flow of about 140 [A] can be obtained immediately after the filament is fitted to the source head 2. However, when the current flow of the filament is consumed down to about 80 [A], the ion beam becomes unstable and the insulation between the extraction electrode 3 and an acceleration/deceleration electrode deteriorates. (Although omitted from the description of the embodiment, the acceleration/deceleration electrode is located in the vicinity of the extraction electrode 3.)

On the contrary, even in the case where current flow of the filament is worn out to about 80 [A] after the centering adjustment according to this embodiment, the insulation is excellent, and the ion beam is still stable.

Up to now, the source head 2 is exchanged for a new one every 2 to 5 days. On the contrary, the head source 2 can be used for about 14 days in the longest after the centering adjustment according to this embodiment, and the exchange frequency of the source head 2 is reduced to about ⅓.

As a result, because the lifetime of the source head 2 is extended, the number of processing the wafer 80 (FIG. 1) per one source head 2 can be increased to about four times.

This embodiment as described above is capable of obtaining the following advantages.

(1) A laser beam can be irradiated on the actual ion beam axis.

(2) Because a precision in the centering adjustment is improved, the abrasion of the opening 16, and the generation of the deposit that is deposited on the extraction electrode 3 are remarkably suppressed, thereby making it possible to significantly reduce the maintenance frequency of the ion source apparatus 1. That is, the continuous running time of the semiconductor manufacturing apparatus 100 can be remarkably extended.

(3) Because the centering adjustment of the extraction electrode 3 can be conducted in the atmosphere, it is unnecessary to create vacuum in the semiconductor manufacturing apparatus 100 in several hours. Also, when the spared ion source apparatus 1 is prepared, and alternately used in the semiconductor manufacturing apparatus 100, one ion source apparatus 1 can be used to operate the semiconductor manufacturing apparatus 100 while another ion source apparatus 1 is being adjusted.

(4) In the case where the centering adjustment mechanism is incorporated into the ion source apparatus 1, a high-temperature resistant structure is required. However, because the light emitting unit 55 and the reflector 56 can be detachably attached to the ion source apparatus 1, the high-temperature resistant structure is not required.

(5) The operation of the centering adjustment is easy, and the assembling of the housing 5 and the centering adjustment can be easily conducted even by an operator that is not skilled. Also, a variation in the centering adjustment by the operator can be also eliminated.

What is claimed is:

1. An ion beam inspection apparatus used to adjust a position of an extraction electrode that extracts an ion beam from an ion source in a semiconductor manufacturing apparatus in which ions are implanted into a semiconductor, the ion beam inspection apparatus comprising:

a laser beam irradiator for irradiating a laser beam along an ion beam axis toward the extraction electrode from an ion source side; and a pass position detector having only one reflecting mirror for detecting a pass position at which the laser beam passes through the extraction electrode, the pass position detector comprising the only one reflecting mirror disposed at a location on the extraction electrode where the ion beam is to be positioned, and a measurement unit for measuring intensity of the laser beam that is reflected by the reflecting mirror, the pass position of the irradiated laser beam being detected by the measured intensity of the laser beam.

2. An ion beam inspection apparatus used to adjust a position of an extraction electrode that extracts an ion beam from an ion source in a semiconductor manufacturing apparatus in which ions are implanted into a semiconductor, the ion beam inspection apparatus comprising:

a laser beam irradiator for irradiating a laser beam along an ion beam axis toward the extraction electrodes from an ion source side; and a pass position detector, having no mirror, for detecting a pass position at which the laser beam passes through the extraction electrode, the pass position detector comprising a light receiver disposed at a location on the extraction electrode where the ion beam is to be positioned, and a measurement unit for measuring intensity of the laser beam that is received by the light receiver, the pass position of the irradiated laser beam being detected by the measured intensity of the laser beam.

3. An ion beam inspection apparatus according to claim 2; further comprising a position adjustor for adjusting the position of the extraction electrode so that the measured intensity of the laser beam becomes maximum.

4. An ion beam inspection apparatus according to claim 1; further comprising a position adjustor for adjusting the position of the extraction electrode so that the measured intensity of the laser beam becomes maximum.

5. An ion beam inspecting method that is conducted when adjusting a position of an extraction electrode that extracts an ion beam from an ion source in a semiconductor manufacturing apparatus where ions are implanted into a semiconductor, the ion beam inspecting method comprising:

irradiating a laser beam along an ion beam axis toward the extraction electrode from an ion source side by a laser beam irradiator; and receiving one of (i) the laser beam irradiated from the laser beam irradiator directly without reflection and (ii) the laser beam irradiated from the laser beam irradiator after only one reflection by a mirror to detect a pass position at which the irradiated laser beam passes through the extraction electrode by a pass position detector.

6. A semiconductor manufacturing apparatus having an ion source and an extraction electrode that extracts an ion beam from the ion source, which irradiates the extracted ion beam to a semiconductor to implant ions into the semiconductor, the semiconductor manufacturing apparatus comprising:

a laser beam irradiator for irradiating a laser beam on an ion beam axis toward the extraction electrode from an ion source side;

a pass position detector for detecting a pass position at which the irradiated laser beam passes through the extraction electrode; and an adjustor for adjusting a position of the extraction electrode so that the detected pass position becomes the pass position of the ion beam.

7. An ion source apparatus comprising:

a housing having two opposed spaced-apart end portions;

an ion source removably attached to one end portion of the housing for producing ions within the interior of the housing;

an extraction electrode disposed in the interior of the housing for extracting an ion beam from the ion source along an ion beam axis toward the other end portion of the housing;

a laser beam irradiator removably attachable to the one end of the housing in place of the ion source for irradiating a laser beam along the ion beam axis toward the extraction electrode; and a pass position detector removably attachable to the extraction electrode for detecting a pass position at which the laser beam passes through the extraction electrode.

8. An ion source apparatus according to claim 7; further including an adjustor for adjusting the position of the extraction electrode so that the detected pass position of the laser beam becomes the pass position of the ion beam.

9. An ion source apparatus according to claim 8; wherein the adjustor adjusts the extraction electrode in a horizontal direction that is perpendicular to the ion beam axis and in an angular direction about an axis that is perpendicular to the ion beam axis.

10. An ion source apparatus according to claim 8; wherein the adjustor includes plural motors that adjust the extraction electrode in plural degrees of freedom.

11. An ion source apparatus according to claim 7; wherein the pass position detector comprises a reflecting mirror removably attachable to the extraction electrode such that the reflecting mirror is disposed at the location where the ion beam is to be positioned for reflecting the laser beam back along the ion beam axis, and a measurement unit that measures the intensity of the reflected laser beam from which the pass position is detected.

12. An ion source apparatus according to claim 7; wherein the pass position detector comprises a light receiver removably attachable to the extraction electrode such that the light receiver is disposed at a location where the ion beam is to be positioned for receiving the laser beam, and a measurement unit that measures the intensity of the received laser beam from which the pass position is detected.

13. An ion source apparatus according to claim 7; wherein the ion source has a flange at one and thereof that is removably attached at a predetermined position to the one end portion of the housing with the ion source extending into the interior of the housing, and the laser beam irradiator has a flange that is removably attachable at the predetermined position to the one end portion of the housing in place of the ion source.

14. An ion source apparatus according to claim 13; wherein the flange of the ion source and the flange of the laser beam irradiator are each fixed at least at three points to an end surface of the housing when the flange is removably attached to the housing.

15. An ion source apparatus according to claim 14; wherein the at least three points are not collinear on the end surface of the housing.

16. An ion source apparatus according to claim 15; wherein the at least three points are circumferentially spaced apart from one another on the surface of the housing.

17. An ion source apparatus according to claim 13; wherein the pass position detector comprises a reflecting mirror removably attachable to the extraction electrode such that the reflecting mirror is disposed at the location where the ion beam is to be positioned for reflecting the laser beam back along the ion beam axis, and a measurement unit that measures the intensity of the reflected laser beam from which the pass position is detected.

18. An ion source according to claim 13; wherein the pass position detector comprises a light receiver removably attachable to the extraction electrode such that the light receiver is disposed at a location where the ion beam is to be positioned for receiving the laser beam, and a measurement unit that measures the intensity of the received laser beam from which the pass position is detected.

19. An ion source according to claim 13; further comprising an adjustor for adjusting the position of the extraction electrode so that the measured intensity of the laser beam becomes a maximum.

* * * * *